United States Patent [19]
Hatada et al.

[11] Patent Number: 5,864,267
[45] Date of Patent: Jan. 26, 1999

[54] ELECTRONIC-TUNING TYPE RADIO-FREQUENCY TUNING CIRCUIT

[75] Inventors: Shigeru Hatada; Masami Osawa, both of Tsurugashima, Japan

[73] Assignee: Toko, Inc., Japan

[21] Appl. No.: 779,242

[22] Filed: Jan. 3, 1997

[30] Foreign Application Priority Data

Jan. 31, 1996 [JP] Japan .................................... 8-037254

[51] Int. Cl.[6] .................................. H03J 3/00; H03H 7/09
[52] U.S. Cl. ............................. 334/61; 333/174; 333/177
[58] Field of Search .................................. 334/15, 40, 61, 334/64, 71; 333/177, 178, 174, 175, 176, 179, 180

[56] References Cited

U.S. PATENT DOCUMENTS

| | | | |
|---|---|---|---|
| 1,944,119 | 1/1934 | Braden | 333/177 X |
| 2,104,792 | 1/1938 | Crossley et al. | 333/178 |
| 2,194,566 | 3/1940 | Mountjoy | 333/178 |
| 2,234,461 | 3/1941 | Tubbs | 333/178 X |
| 2,238,763 | 4/1941 | Winkler | 334/61 |

*Primary Examiner*—Seungsook Ham
*Attorney, Agent, or Firm*—Londa and Traub LLP

[57] ABSTRACT

A radio-frequency tuning circuit includes an input tuning transformer, and an output tuning transformer. The input tuning transformer comprises a primary coil adapted to serve as input coil, and a secondary coil to which a pair of variable-capacitance diodes having cathodes thereof connected together are connected in parallel therewith to form a first tuning circuit. The output tuning transformer comprises a primary coil to which a variable-capacitance element is connected to form a second tuning circuit, and a secondary coil adapted to serve as output coil. The input and output tuning transformers are connected in such a manner as to form a double-tuning circuit. Q-factor of the output tuning transformer is made to be twice as high as that of the input tuning transformer, and resonant impedance of the first tuning circuit and that of the second tuning circuit are made to be substantially equal to each other.

2 Claims, 3 Drawing Sheets

ELECTRONIC-TUNING TYPE RADIO-FREQUENCY TUNING CIRCUIT

BACKGROUND OF THE INVENTION

1. Field of the Invention

The present invention relates to a radio-frequency tuning circuit adapted to be used for RF stage of a superheterodyne receiver, thereby suppressing generation of second harmonic signal.

2. Description of the Prior Art

In order to have a better understanding of the present invention, description will first be made with reference to FIGS. 5 and 6 of the accompanying drawings, which illustrate the circuit arrangement of conventional radio-frequency tuning circuit and frequency versus attenuation characteristics thereof respectively.

As will be seen, in the conventional radio-frequency tuning circuit shown in FIG. 5, an input tuning transformer T7 and output tuning transformer T8 are connected together in such a manner as to constitute a double-tuning circuit.

The input tuning transformer T7 comprises a primary coil L18, and a secondary coil L19. A capacitor C7, and a pair of variable-capacitance diodes comprising variable-capacitance diodes D10 and D11 having their cathodes connected together, are connected in parallel with the secondary coil L19 of the input tuning transformer T7. Thus, a tuning circuit 51 is formed by the secondary coil L19, variable-capacitance diodes D10, D11, and capacitor C7.

Further, the output transformer T8 comprises a primary coil L20, and secondary coil L21. A variable-capacitance diode D12 is connected to the primary coil L20 of the output tuning transformer T8, and a capacitor C8 is connected in parallel with the primary coil L20 of the output tuning transformer T8. Thus, a further tuning circuit 52 is formed by the primary coil L20, variable-capacitance diode D12, and capacitor C8.

The input tuning transformer T7 has the secondary coil L19 thereof tied to a tap of the primary coil L20 of the output tuning transformer T8 so that the tuning circuits 51 and 52 constitute the double-tuning circuit. R7 and R8 are bias resistors.

With the above conventional radio-frequency tuning circuit, signal derived from antenna circuit (not shown) is inputted to the input tuning transformer T7, and thus the signal as inputted is transferred from the primary coil L18 to the secondary coil L19 so that a signal of receiving frequency is selected at the tuning circuit 51. The signal as selected at the tuning circuit 51 is then transferred to the primary coil L20 of the output tuning transformer T8 so that signal of the receiving frequency is selected at the tuning circuit 52, the signal which in turn is transferred to and outputted from the secondary coil L21 of the output tuning transformer T8.

The input tuning transformer T7 and output tuning transformer T8 which constitute the conventional radio-frequency tuning circuit are ones exhibiting identical Q-factor. Further, the variable-capacitance diodes D10, D11, and D12 are ones having identical voltage versus capacitance characteristics. Still further, only the tuning circuit 51 uses a pair of variable-capacitance diodes, or the variable-capacitance diodes D10 and D11 having the cathodes thereof connected together, for the purpose of suppressing generation of the second harmonic signal which tends to be caused because of the voltage versus capacitance characteristics of the variable-capacitance diodes being non-linear.

The resonant impedance of the tuning circuit 51 is given by $$Z_7 = \omega QT_7/TC_7 \qquad (1)$$

where $QT_7$ is the Q-factor of the input tuning transformer $T_7$; $TC_7$ is the combined capacitance of the tuning circuit 51; and $\omega$ represents $2\pi f$.

The resonant impedance of the tuning circuit 52 is given by $$Z_8 = \omega QT_8/TC_8 \qquad (2)$$

where $QT_8$ is the Q-factor of the output tuning transformer $T_8$; and $TC_8$ is the combined capacitance of the tuning circuit 52; and $\omega$ represents $2\pi f$.

As mentioned above, the variable-capacitance diodes $D_{10}$, $D_{11}$ and $D_{12}$ have identical voltage versus capacitance characteristics; and only the tuning circuit 51 uses a pair of variable-capacitance diodes (more specifically, two variable-capacitance diodes connected in series with each other); thus, the combined capacitance of the tuning circuit 52 is twice as high as that of the tuning circuit 51, and equation (2) can be rewritten as follows:

$$Z_8 = \omega QT_8/2TC_7 \qquad (3).$$

Further, also as mentioned above, the input tuning transformer $T_7$ and output tuning transformer $T_8$ exhibit identical Q-factor; thus, the resonant impedance of the tuning circuit 52 and that of the tuning circuit 51 can be expressed as follows:

$$Z_7/Z_8 = 2 \qquad (4)$$

As will be seen, with the above conventional radio-frequency tuning circuit, despite the fact that the Q-factor of the input transformer $T_7$ and that of the output tuning transformer $T_8$ are equal to each other, the combined capacitance of the tuning circuit 52 is twice as high as that of the tuning circuit 51 so that the resonant impedance of tuning circuit 52 turns out to be twice as high as that of the tuning circuit 51. Thus, such difference in resonant impedance between the tuning circuits 51 and 52 results in the Q-factors of these tuning circuits being different from each other.

Thus, the radio-frequency tuning circuit including the double-tuning circuit constituted by the tuning circuits 51 and 52 turns out to be a circuit which is poor in terms of Q-factor balance. Another disadvantage of the above conventional radio-frequency tuning circuit is such that because of the fact that the bandwidth thereof, is broadened as shown at 63 in FIG. 6 for the purpose of eliminating sensitivity difference which tends to be caused due to tracking error, the circuit is susceptible to occurrence of ripple as shown by the solid characteristic curve 61 in FIG. 6.

When ripple occurs in the characteristics of the radio-frequency tuning circuit as mentioned above, frequency F1 at which attenuation is minimized is lower than the center frequency F0 of such characteristics with no ripple as shown by the dotted curve 62. This means that the above conventional radio-frequency tuning circuit has such a drawback that when the frequency F1 for minimum attenuation is deviated from the receiving frequency due to variation in temperature and/or humidity, the signal of the receiving frequency tends to be attenuated so that the sensitivity is deteriorated.

Furthermore, with the radio-frequency tuning circuit having such characteristics, when it is tuned to receive a signal of 1010 KHz for example, there is a tendency that the frequency F1 for minimum attenuation is brought into registration with 1010 KHz; thus the bandwidth 63 becomes broader at a portion higher than the frequency F1, so that assuming that signals of 1030 KHz and 1050 KHz, both of which fall within the bandwidth, are inputted, these signals are transferred without being attenuated. That is, despite the attempt to suppress second harmonic interference at the tuning circuit 51, the signal of 1030 KHz is permitted to reach the tuning circuit 52, so that the second harmonic of the 1030 KHz signal, i.e., a signal of 2060 KHz is generated at the tuning circuit 52. This gives rise to a problem that there is caused such intermodulation that the second harmonic signal of 2060 KHz and the signal of 1050 KHz are combined, so that a signal of 1010 KHz is generated.

SUMMARY OF THE INVENTION

Accordingly, it is an object of the present invention to provide a radio-frequency tuning circuit which is so designed that occurrence of ripple in the frequency versus attenuation characteristics thereof can be avoided even if the bandwidth thereof is broadened, and the sensitivity thereof can be prevented from being deteriorated by frequency deviation due to variation in temperature and/or humidity.

Another object of the present invention is to provide a radio-frequency tuning circuit capable of suppressing intermodulation which tends to be caused by second harmonic.

According to an aspect of the present invention, there is provided a radio-frequency tuning circuit which comprises an input tuning transformer comprising a primary coil adapted to serve as input coil, and a secondary coil which is used to form a first tuning circuit; and an output tuning transformer comprising a primary coil which is used to form a second tuning circuit, and a secondary coil adapted to serve as output coil; wherein said input tuning transformer and said output tuning transformer are connected to form a double-tuning circuit, and Q-factor of said output tuning transformer is made to be twice as high as that of said input tuning transformer. The input and output tuning transformers may be connected to each other through an inductance element.

According to a second aspect of the present invention, there is provided a radio-frequency tuning circuit which comprises an input tuning transformer comprising a primary coil adapted to serve as input coil, and a secondary coil to which a pair of variable-capacitance diode elements having cathodes thereof connected together are connected to form a first tuning circuit; and an output tuning transformer comprising a primary coil to which a variable-capacitance element is connected to form a second tuning circuit, and a secondary coil adapted to serve as output coil; wherein said input tuning transformer and said output tuning transformer are connected to form a double-tuning circuit, and Q-factor of said output tuning transformer is made to be twice as high as that of said input tuning transformer. The input and output tuning transformers may be connected to each other through an inductance element.

According to a third aspect of the present invention, there is provided a radio-frequency tuning circuit which comprises an input tuning transformer comprising a primary coil adapted to serve as input coil, and a secondary coil to which a pair of variable-capacitance diode elements having cathodes thereof connected together are connected to form a first tuning circuit; and an output tuning transformer comprising a primary coil to which a variable-capacitance diode element is connected to form a second tuning circuit, and a secondary coil adapted to serve as output coil; wherein said input tuning transformer and said output tuning transformer are connected to form a double-tuning circuit, and resonant impedance of said first tuning circuit and resonant impedance of said second tuning circuit are made substantially equal to each other. The input and output tuning transformers may be connected to each other through an inductance element.

Other objects, features and advantages of the present invention will become apparent from the ensuing description taken in conjunction with the accompanying drawings.

DESCRIPTION OF THE PREFERRED EMBODIMENTS

The present invention will now be described with reference to FIGS. 1 to 4 showing embodiments thereof.

Figure 1:
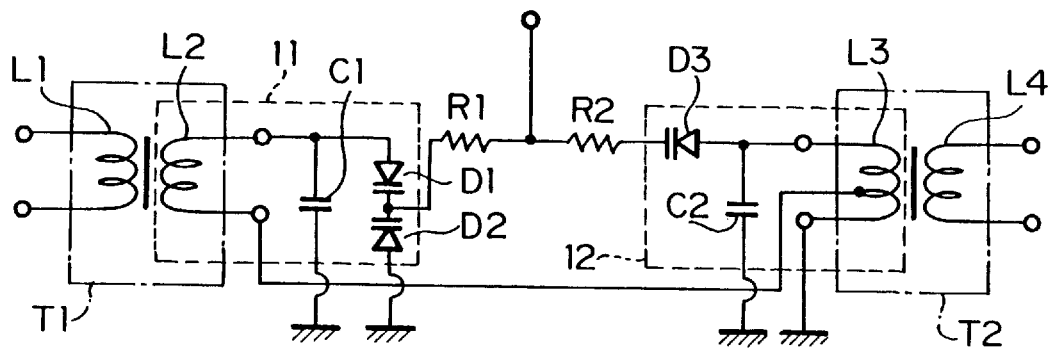
FIG. 1 is a circuit diagram showing the radio-frequency tuning circuit according to a first embodiment of the present invention.

FIG. 1 is a circuit diagram showing the radio-frequency tuning circuit according to a first embodiment of the present invention, which includes an input tuning transformer T1, an output tuning transformer T2, and tuning circuits 11 and 12.

The input tuning transformer T1 comprises a primary coil L1 and secondary coil L2, the primary coil L1 being used as an input coil. A pair of variable-capacitance diodes D1 and D2 having their cathodes connected together, and a capacitor C1 are connected in parallel with the secondary coil L2. A tuning circuit 11 is constituted by the secondary coil L2, variable-capacitance diodes D1 and D2, and capacitor C1.

The output tuning transformer T2 comprises a primary coil L3 and secondary coil L4, the secondary coil L4 being used as an output coil. A variable-capacitance diode D3 is connected to one end of the primary coil L3, and a capacitor C2 is connected in parallel with the primary coil L3. Another tuning circuit 12 is formed by the primary coil L3, variable-capacitance diode D3 and capacitor C2. The primary coil L3 of the output tuning transformer T2 is provided with a tap to which is connected the other end of the secondary coil L2 of the input tuning transformer T1.

A double-tuning circuit is formed by the tuning circuit 11 of the input tuning transformer T1, and the tuning circuit 12 of the output tuning transformer T2.

A bias resistor R1 is connected to the cathodes, connected together, of the variable-capacitance diodes D1 and D2, and bias resistor R2 is coupled to the cathode of the variable-capacitance diode D3. Resistance values for the bias resistors R1 and R2 are set up to be equal to each other.

The input tuning transformer T1 and output tuning transformer T2 which are connected in the manner as mentioned above are differentiated from each other in terms of Q-factor.

More specifically, the Q-factor of the output tuning transformer T2 is set up to be twice as high as that of the input tuning transformer T1. Further, the variable-capacitance diodes D1, D2, and D3 are ones having substantially identical voltage versus capacitance characteristics. The cathode of the variable-capacitance diode D1 is connected to the cathode of the variable-capacitance diode D2.

The input tuning transformer T1 and variable-tuning diodes D1 and D2 having their cathodes tied together, which constitute the tuning circuit 11, are connected is the manner as described above. Further, the output tuning transformer T2 and variable-capacitance diode D3 which constitute the tuning circuit 12 are connected in the manner as mentioned above. The resonant impedance of the tuning circuit 11 can be expressed as follows:

$$Z_1 = \omega QT_1/TC_1 \qquad (5)$$

where $QT_1$ is the Q-factor of the input tuning transformer $T_1$; $TC_1$ is the combined capacitance of the tuning circuit 11; and $\omega$ represents $2\pi f$.

The resonant impedance of the tuning circuit 12 can be written as follows:

$$Z_2 = \omega QT_2/TC_2 \qquad (6)$$

where $QT_2$ is the Q-factor of the input tuning transformer $T_2$; $TC_2$ is the combined capacitance of the tuning circuit 12; and so represents $2\pi f$.

As mentioned above, the variable-capacitance diodes $D_1$, $D_2$ and $D_3$ have identical voltage versus capacitance characteristics; and only the tuning circuit 11 uses a pair of variable-capacitance diodes; thus, the combined capacitance of the tuning circuit 12 is twice as high as that of the tuning circuit 11, and equation (6) can be rewritten as follows:

$$Z_2 = \omega QT_2/2TC_1 \qquad (7).$$

As mentioned above, however, the Q-factor of the output tuning transformer $T_2$ is set up to be twice as high as that of the input tuning transformer $T_1$; thus the resonant impedance of the tuning circuit 11 and that of the tuning circuit 12 can be expressed as follows:

$$Z_1/Z_2 = 1 \qquad (8)$$

From the foregoing discussion, it will be seen that despite the fact that the combined capacitance of the tuning circuit 12 is twice as high as that of the tuning circuit 11, the resonant impedance of these tuning circuits turn out to be equal to each other since the Q-factor of the output tuning transformer $T_2$ is twice as high as that of the input tuning transformer $T_1$.

With the radio-frequency tuning circuit as constructed above, signal derived from an antenna circuit (not shown) is inputted to the primary coil L1 of the input tuning transformer T1, and the signal thus inputted is transferred to the secondary coil L2 of the input tuning transformer T1. Thus, a signal of the receiving frequency is selected at the tuning circuit 11, which uses the secondary coil L2 of the tuning transformer T1, and transferred to the primary coil L3 of the output tuning transformer T2.

The signal as transferred to the output tuning transformer T2 is processed such that signal of the receiving frequency is selected at the tuning circuit 12; and the signal thus selected is transferred to and outputted from the secondary coil L4 of the transformer T2.

Figure 2:
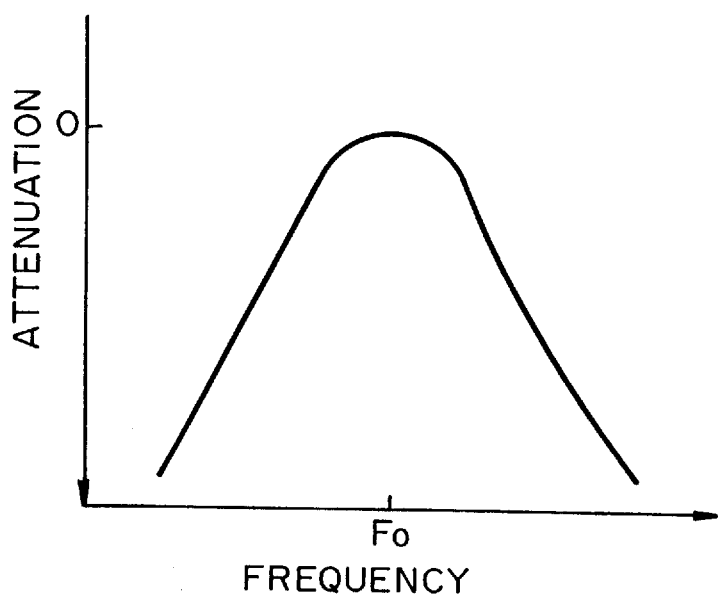
FIG. 2 is a view showing the characteristics of the radio-frequency tuning circuit embodying the present invention.

FIG. 2 illustrates the characteristics of the radio-frequency tuning circuit embodying the present invention, wherein the horizontal axis shows frequency, and the vertical axis indicates attenuation.

As will be seen, this radio-frequency tuning circuit exhibits such characteristics that the frequency at which attenuation is minimized is brought into registration with the center frequency F0; with such characteristics, no ripple occurs, so that variation in the attenuation factor within the bandwidth which tends to be caused due to variation in the temperature and/or humidity, is minimized. Thus, difference in sensitivity due to tracking error can also be minimized.

Furthermore, with the present radio-frequency tuning circuit, it is possible to bring the center frequency F0 into registration with any desired receiving frequency by changing bias voltage applied via the bias resistors R1 and R2 to the variable-capacitance diodes constituting the tuning circuits.

Figure 3:
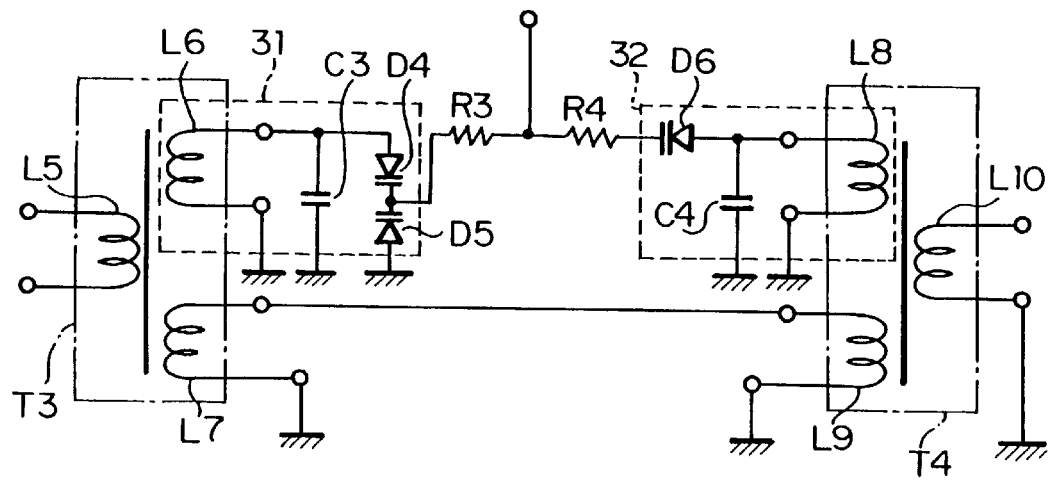
FIG. 3 is a circuit diagram showing the radio-frequency tuning circuit according to a second embodiment of the present invention.

FIG. 3 shows the radio-frequency tuning circuit according to a second embodiment of the present invention, which comprises an input tuning transformer T3, an output tuning transformer T4, and tuning circuits 31 and 32.

The input tuning transformer T3 comprises a primary coil L5, which is used as input coil, and a secondary coil which is divided into two sections adapted to serve as secondary coil L6 and a primary coupling coil L7 respectively. To the secondary coil L6 are connected, in parallel therewith, a pair of variable-capacitance diodes D4 and D5 having their cathodes connected together, and a capacitor C3. A tuning circuit 31 is formed by the secondary coil L6, variable-capacitance diodes D4 and D5, and capacitor C3. The primary coupling coil L7 is electromagnetically coupled to the secondary coil L6.

The output tuning transformer T4 comprises a primary coil which is divided into two sections adapted to serve as primary coil L8 and secondary coupling coil L9 respectively, and a secondary coil L10 which is used as output coil. A variable-capacitance diode D6 is connected to the primary coil L8, and a capacitor C4 is connected in parallel with the primary coil L8. Another tuning circuit 32 is formed by the primary coil L8, variable-capacitance diode D6, and capacitor C4. The secondary coupling coil L9 is electromagnetically coupled to the primary coil L8.

The input tuning transformer T3 and output tuning transformer T4 are arranged in such a manner that the primary coupling coil L7 and secondary coupling coil L9 are coupled to each other and a double-tuning circuit is formed by the tuning circuits 31 and 32. Resistance values for the bias resistors R3 and R4 are set up to be equal to each other.

The Q-factor of the output tuning transformer T4 is set up to be twice as high as that of the input tuning transformer T3. The variable-capacitance diodes D4, D5 and D6 are set up to represent substantially identical voltage versus capacitance characteristics. The resonant impedance of the tuning circuit 31 is made to be equal to that of the tuning circuit 32.

In the present radio-frequency tuning circuit, signal derived from the antenna circuit is inputted to the primary coil L5 of the input tuning transformer T3, and then transferred from the primary coil L5 to the secondary coil L6 so that signal of the receiving frequency is selected at the tuning circuit 31. The signal thus selected at the tuning circuit 31 is transferred to the primary coupling coil L7, and thence to the output tuning transformer T4.

The signal as transferred to the output tuning transformer T4 is transferred from the secondary coupling coil L9 to the primary coil L8 so that signal of the receiving frequency is selected at the tuning circuit 32. The signal as selected at the tuning circuit 32 is transferred to and outputted from the secondary coil L10.

With this radio-frequency tuning circuit, the frequency at which attenuation is minimized is brought into registration with the center frequency, thereby minimizing variation in the quantity of attenuation within the bandwidth, while at the same time making the quantity of attenuation with frequency to vary more sharply than in the case of the aforementioned first embodiment of the present invention.

Figure 4:
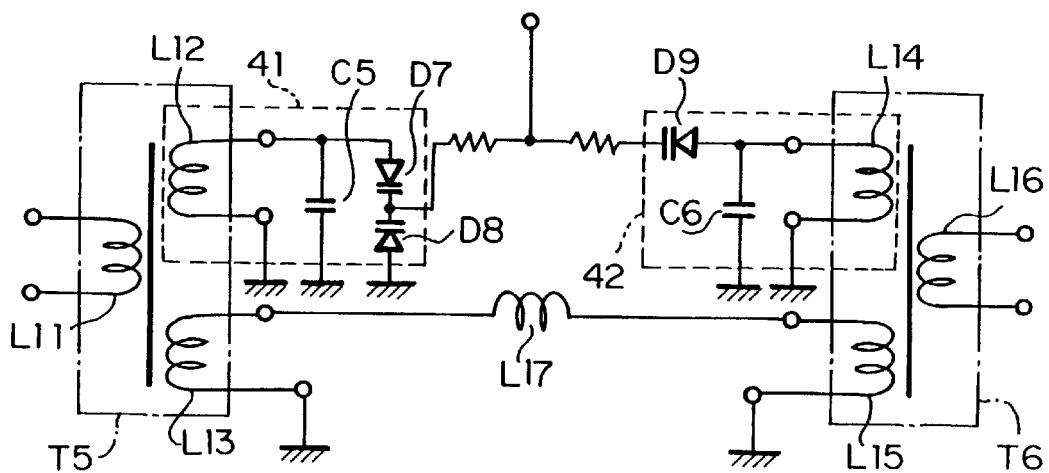
FIG. 4 is a circuit diagram showing the radio-frequency tuning circuit according to a third embodiment of the present invention.
Figure 5:
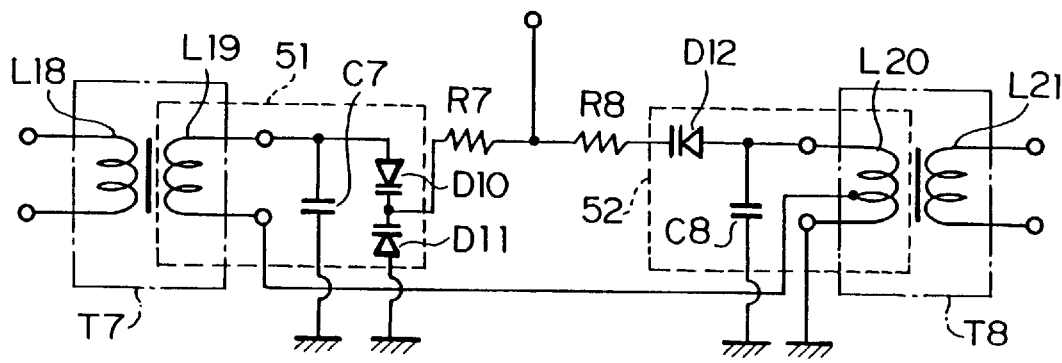
FIG. 5 is a circuit diagram showing a conventional radio-frequency tuning circuit.
Figure 6:
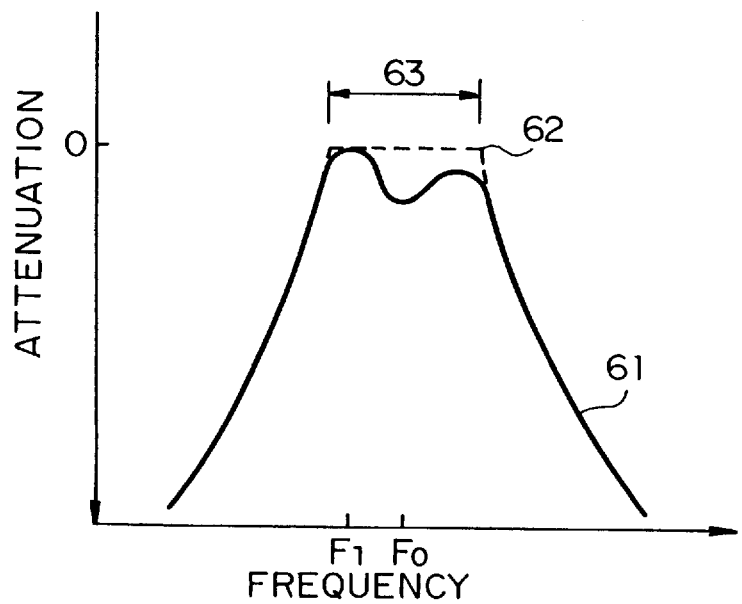
FIG. 6 illustrates the characteristics of the conventional radio-frequency tuning circuit.

FIG. 4 shows the radio-frequency tuning circuit according to a third embodiment of the present invention, which comprises an input tuning transformer T5, an output tuning transformer T6, and tuning circuits 41 and 42.

The input tuning transformer T5 comprises a primary coil L11, secondary coil L12, and a primary coupling coil L13. To the secondary coil L12 are connected, in parallel therewith, a pair of variable-capacitance diodes D7 and D8 having their cathodes connected together, and a capacitor C5. A tuning circuit 41 is formed by the secondary coil L12, variable-capacitance diodes D7 and D8, and capacitor C5.

The output tuning transformer T6 comprises a primary coil L14, secondary coupling coil L15, and secondary coil L16. A variable-capacitance diode D9 is connected to the primary coil L14, and a capacitor C6 is connected in parallel with the primary coil L14. A tuning circuit 42 is formed by the primary coil L14, variable-capacitance diode D9, and capacitor C6.

The input tuning transformer T5 and output tuning transformer T6 are arranged in such a manner that the primary and secondary coupling coils L13 and L15 are connected to each other through a coil element L17, and a double-tuning circuit is formed by the tuning circuits 41 and 42.

Signal derived from the input tuning transformer T5 is transferred to the output tuning transformer T6, with signal of higher frequency than the receiving band (520 KHz–1710 KHz) being suppressed with the aid of the coil element L17; the signal is outputted from the secondary coil L16 of the output tuning transformer T6.

Each of the above-described radio-frequency tuning circuits according to the present invention has ripple-free characteristics. Thus, assuming that signals of 1030 KHz and 1050 KHz are inputted when signal of 1010 KHz for example is being received through use of the present radio-frequency tuning, it happens that each of signals as inputted is attenuated so that energy causing intermodulation when such signals are transferred to the second tuning circuit, is suppressed.

As will be appreciated from the foregoing discussion, the radio-frequency tuning circuit according to the present invention comprises an input tuning transformer comprising a primary coil serving as input coil, and a secondary coil to which a pair of variable-capacitance diodes are connected in parallel therewith to form a first tuning circuit; and an output tuning transformer comprising a primary coil to which a variable-capacitance diode is connected to form a second tuning circuit, and a secondary coil adapted for serving as output coil, and wherein the input and output tuning transformers are connected in such a manner as to constitute a double-tuning circuit; and the Q-factor of the input tuning transformer is made to be twice as high as that of output tuning transformer so that the resonant impedance of the first tuning circuit becomes equal to that of the second tuning circuit, thereby making it possible to prevent occurrence of ripple, while at the same time making it possible to prevent sensitivity from being deteriorated by frequency deviation due to a variation in temperature and/or humidity and suppress intermodulation which tends to be caused due to second harmonic.

While the present invention has been illustrated and described with respect to some specific embodiments thereof, it is to be understood that the present invention is by no means limited thereto. Various changes and modifications will become possible without departing from the scope and spirit of the present invention; it is possible that the secondary coil of the input tuning transformer and the primary coil of the output tuning transformer may be connected to each other through a coil element, for example.

What is claimed is:

1. An electronic-tuning type radio-frequency tuning circuit, comprising:

an input tuning transformer comprising a primary coil adapted to serve as input coil, and a secondary coil to which a pair of variable-capacitance diode elements having cathodes thereof connected together are connected to form a first tuning circuit; and an output tuning transformer comprising a primary coil to which a variable-capacitance diode element is connected to form a second tuning circuit, and a secondary coil adapted to serve as output coil;

wherein said input tuning transformer and said output tuning transformer are connected to form a double-tuning circuit; and a voltage versus capacitance characteristic of each of said pair of variable-capacitance diode elements of said first tuning circuit is set up to be substantially identical to the voltage versus capacitance characteristic of said variable-capacitance diode element of said second tuning circuit; and Q-factor of said output tuning transformer is made to be twice as high as that of said input tuning transformer to which said pair of variable-capacitance diode elements are connected, whereby resonant impedance of said first tuning circuit and resonant impedance of said second tuning circuit are made to substantially equal each other.

2. A radio-frequency tuning circuit according to claim 1, wherein said input tuning transformer and said output tuning transformer are connected to each other through an inductance element.

* * * * *